United States Patent [19]
Miller et al.

[11] Patent Number: 6,022,414
[45] Date of Patent: Feb. 8, 2000

[54] SINGLE BODY INJECTOR AND METHOD FOR DELIVERING GASES TO A SURFACE

[75] Inventors: Adam Q. Miller, Felton; Daniel M. Dobkin, Sunnyvale, both of Calif.

[73] Assignee: Semiconductor Equipment Group, LLC, Scotts Valley, Calif.

[21] Appl. No.: 08/892,469

[22] Filed: Jul. 14, 1997

Related U.S. Application Data

[63] Continuation-in-part of application No. 08/621,772, Mar. 22, 1996, Pat. No. 5,683,516, which is a continuation of application No. 08/276,815, Jul. 18, 1994, abandoned.

[51] Int. Cl.[7] ............................... C23C 16/00; C23F 1/02
[52] U.S. Cl. ..................... 118/718; 118/715; 156/345
[58] Field of Search ................................. 118/715, 718, 118/725; 156/345

[56] References Cited

U.S. PATENT DOCUMENTS

| | | | |
|---|---|---|---|
| 3,674,453 | 7/1972 | Loukes et al. ............................... | 65/30 |
| 4,123,244 | 10/1978 | Leclercq et al. ......................... | 65/60 C |
| 4,131,659 | 12/1978 | Authier et al. ............................. | 264/25 |
| 4,136,828 | 1/1979 | Anderson et al. ....................... | 239/422 |
| 4,293,326 | 10/1981 | Ternen et al. ............................ | 65/60 D |
| 4,369,031 | 1/1983 | Goldman et al. ....................... | 432/198 |
| 4,446,815 | 5/1984 | Kalbskopf et al. ...................... | 118/718 |
| 4,469,045 | 9/1984 | Chesworth ............................... | 118/718 |

(List continued on next page.)

FOREIGN PATENT DOCUMENTS

| | | | |
|---|---|---|---|
| 322466 A1 | 12/1987 | European Pat. Off. ...... | H01L 21/285 |
| 605725 A1 | 9/1992 | European Pat. Off. ...... | H01L 21/205 |
| 107 723 | 12/1973 | Germany ....................... | C23C 13/08 |
| 2 004 851 | 8/1978 | United Kingdom ........... | C01G 19/02 |

OTHER PUBLICATIONS

Willard, Hobart H., et al., *Instrumental Methods of Analysis*, Fifth Ed. (1974), pp. 352–353.

*Primary Examiner*—Bruce Breneman
*Assistant Examiner*—Jeffrie R. Lund
*Attorney, Agent, or Firm*—Flehr Hobach Test Albritton & Herbert, LLP

[57] ABSTRACT

A single body injector for delivering gases to a surface is provided. The injector is comprised of an elongated member with end surfaces and at least one gas delivery surface extending along the length of the member and which includes a number of elongated passages formed therein. Also formed within the member are a number of thin distribution channels which extend between the elongated passages and the gas delivery surface. In another embodiment of the invention a number of metering tubes may be inserted into each elongated passage and are spaced from the walls of the passages and extend between the ends. Gases are conveyed to the elongated passages, through the distribution channels to the gas delivery surface where they are directed to a desired region where they mix, react and form a uniform thin film on the substrate positioned beneath the injector. The gas delivery surface is comprised of rounded side regions and a center recessed region in which instance the thin distribution channels extend between the first elongated passages and the center recessed region of the gas delivery surface. In another embodiment, the injector further contains an elongated passage for receiving an etchant species. The etchant species is conveyed to the gas delivery surface via a distribution channel which extends between the elongated passage and the rounded side regions of the gas delivery surface. The etchant species is distributed along the gas delivery surface where it removes deposited materials along the gas delivery surface and other surfaces within the chamber.

17 Claims, 11 Drawing Sheets

U.S. PATENT DOCUMENTS

| | | | |
|---|---|---|---|
| 4,499,853 | 2/1985 | Miller | 118/725 |
| 4,537,795 | 8/1985 | Nath et al. | 427/39 |
| 4,756,272 | 7/1988 | Kessler et al. | 118/715 |
| 4,834,020 | 5/1989 | Bartholomew et al. | 118/719 |
| 4,986,216 | 1/1991 | Ohmori et al. | 118/730 |
| 5,041,150 | 8/1991 | Grundy et al. | 65/60.51 |
| 5,136,975 | 8/1992 | Bartholomew et al. | 118/715 |
| 5,221,556 | 6/1993 | Hawkins et al. | 427/255 |
| 5,232,508 | 8/1993 | Arena et al. | 118/719 |
| 5,269,847 | 12/1993 | Anderson et al. | 118/715 |
| 5,328,722 | 7/1994 | Ghanayem et al. | 427/250 |
| 5,336,326 | 8/1994 | Karner et al. | 118/723 HC |
| 5,391,232 | 2/1995 | Kanai et al. | 118/715 |
| 5,411,590 | 5/1995 | Hawkins et al. | 118/715 |
| 5,453,124 | 9/1995 | Moslehi et al. | 118/715 |
| 5,456,740 | 10/1995 | Snow et al. | 96/11 |
| 5,487,784 | 1/1996 | Ellis, Jr. | 118/718 |
| 5,653,808 | 8/1997 | MacLeish et al. | 118/715 |
| 5,683,516 | 11/1997 | Dodontney et al. | 118/718 |
| 5,704,982 | 1/1998 | Oudard et al. | 118/718 |
| 5,707,451 | 1/1998 | Robles et al. | 118/715 |
| 5,709,726 | 1/1998 | Terneu et al. | 65/157 |
| 5,728,224 | 3/1998 | Laurent et al. | 118/718 |

SINGLE BODY INJECTOR AND METHOD FOR DELIVERING GASES TO A SURFACE

CROSS-REFERENCE TO RELATED APPLICATIONS

This application is a continuation-in-part of application Ser. No. 08/621,772 filed Mar. 22, 1996 now U.S. Pat. No. 5,683,516; which is a File Wrapper Continuing application of Ser. No. 08/276,815 filed Jul. 18, 1994 now abandoned, the disclosures of which are herein incorporated by reference.

BRIEF DESCRIPTION OF THE INVENTION

The present invention relates to an injector for delivering gaseous chemicals to a surface. More particularly, the invention relates to an improved injector for delivering gaseous chemicals to a surface for depositing uniform films or layers on the surface by chemical vapor deposition (CVD).

BACKGROUND OF THE INVENTION

Chemical vapor deposition (CVD) is a critical component in semiconductor manufacturing. CVD occurs when a stable compound is formed by a thermal reaction or decomposition of certain gaseous chemicals and such compounds are deposited on a surface. CVD systems come in many forms. One apparatus for such a process comprises a conveyorized atmospheric pressure CVD (APCVD) system which is described in U.S. Pat. No. 4,834,020 and is owned by assignee. This patent is incorporated herein by reference. Other CVD apparatus may be used such as plasma-enhanced CVD (PECVD) systems, and low pressure CVD (LPCVD) systems.

One critical component of CVD systems is the injector utilized for delivering gaseous chemicals to the surface. The gases must be distributed over the substrate, so that the gases react and deposit an acceptable film at the surface of the substrate. A function of the injector is to distribute the gases to a desired location in a controlled manner. Controlled distribution of the gases maximizes the chance of complete, efficient and homogeneous reaction of the gases, in part by minimizing pre-mixing and prior reaction of the gases. A complete reaction provides a greater opportunity for a good quality film. If the gas flow is uncontrolled, the chemical reaction will not be optimal and the result will likely be a film which is not of uniform composition. When the film is not of uniform composition, the proper functioning of the semiconductor is impaired. Thus it is important that an injector design facilitates the desired flow of the gases in a controlled manner.

In a prior art injector, owned by the assignee and described in U.S. Pat. No. 5,136,975, a number of stacked plates each including a number of linear hole arrays is utilized. The plates produce a number of cascaded hole arrays and a chute surrounded by a cooling plate is positioned beneath the last hole array. The chute includes a central passage and ducts are formed between the chute and the cooling plate. Chemical lines deliver gases to a top plate which discretely conveys the gases to the top of individual cascaded hole arrays. The gases are fed through cascaded hole arrays which cause the gas to flow in an increasingly uniform manner. The chute passage receives the gases individually and then conveys the gases to a region above a wafer. In this region, the gases mix, react and then form a film or layer on the wafer.

The cascading action described above provides an uniformly distributed gas flow. However, flow control and simplicity of injector design can be improved.

OBJECTS AND SUMMARY OF THE INVENTION

It is an object of this invention to provide an improved apparatus for delivering gaseous chemicals to a surface.

More particularly, it is an object of this invention to provide an improved injector for delivering gaseous chemicals in a controlled manner to a surface for depositing films or layers on the surface by chemical vapor deposition (CVD).

Another object of this invention is to provide a simple injector fabricated from a single block of material, thereby eliminating complicated machined parts requiring precision alignment and positioning.

A further object of this invention is to provide an injector free from internal seals, thereby minimizing maintenance and associated costs.

A further object of this invention is to provide a method for manufacturing the injector of this invention.

A related object of this invention is to provide an injector which improves the uniformity of films deposited on wafers.

These and other objects are achieved by the injector herein disclosed comprising an elongated member with end surfaces and at least one gas delivery surface extending along the length of the member and which includes a number of elongated passages formed therein. Also formed within the member are a number of thin distribution channels which extend between the elongated passages and the gas delivery surface. In another embodiment of the invention a number of metering tubes may be inserted into each elongated passage and are spaced from the walls of said passages and extend between the ends. The metering tubes may contain openings of varying form and dimension which may be directed away from the distribution channels. The metering tubes receive a gaseous chemical which is conveyed along the metering tubes, whereby the gas flows out of the openings, and is conveyed through the corresponding distribution channel and is directed in a substantially controlled manner along the length of the gas delivery surface. In the instance where a number of gases are employed, the distribution channels direct the distribution of such gases to a region where mixing of the gases is desired. In addition the distribution channels prevent chemical fouling of the injector by preventing premature chemical reaction of the gases. The gases are directed to a desired region where they mix, react and form a uniform thin film on the substrate positioned beneath the injector.

In an alternative embodiment an injector is provided which further contains an elongated passage for receiving an etchant species. The etchant species is conveyed to the gas delivery surface via a distribution channels which extends between the elongated passage and the gas delivery surface. The etchant species is distributed along the gas delivery surface where it removes deposited materials along the gas delivery surface and other surfaces within the chamber.

In another alternatibe embodiment an injector is provided comprising an elongated member with end surfaces and at least one gas delivery surface extending along the length of the member and which includes a number of first elongated passages formed therein for received a gas. The gas delivery surface contains rounded side regions and a center recessed region. Also formed within the member are a number of thin distribution channels which extend between the first elongated passages and the center recessed region of the gas delivery surface. In another embodiment, the injector further includes at least one second elongated passage formed therein for receiving an etchant species. The etchant species is convey via at least one thin distribution channel which extends between the second elongated passage and one of the rounded side regions of the gas delivery surface. As described above, metering tubes may be inserted into each elongated passage and are spaced from the walls of said passages and extend between the ends.

In another embodiment, an injector assembly is provided. The injector assembly comprises a single injector member having end surfaces and at least one elongated gas delivery surface extending along the length of the injector member for delivering gases to the substrate; and a vent member having end surfaces and at least one elongated external surface extending along the length of the vent member. The vent member is positioned adjacent and spaced from the injector member to define an exhaust channel therebetween for removing the gas.

BRIEF DESCRIPTION OF THE DRAWINGS

Other objects and advantages of the invention become apparent upon reading of the detailed description of the invention provided below and upon reference to the drawings, in which.

DETAILED DESCRIPTION OF THE INVENTION

Figure 1:
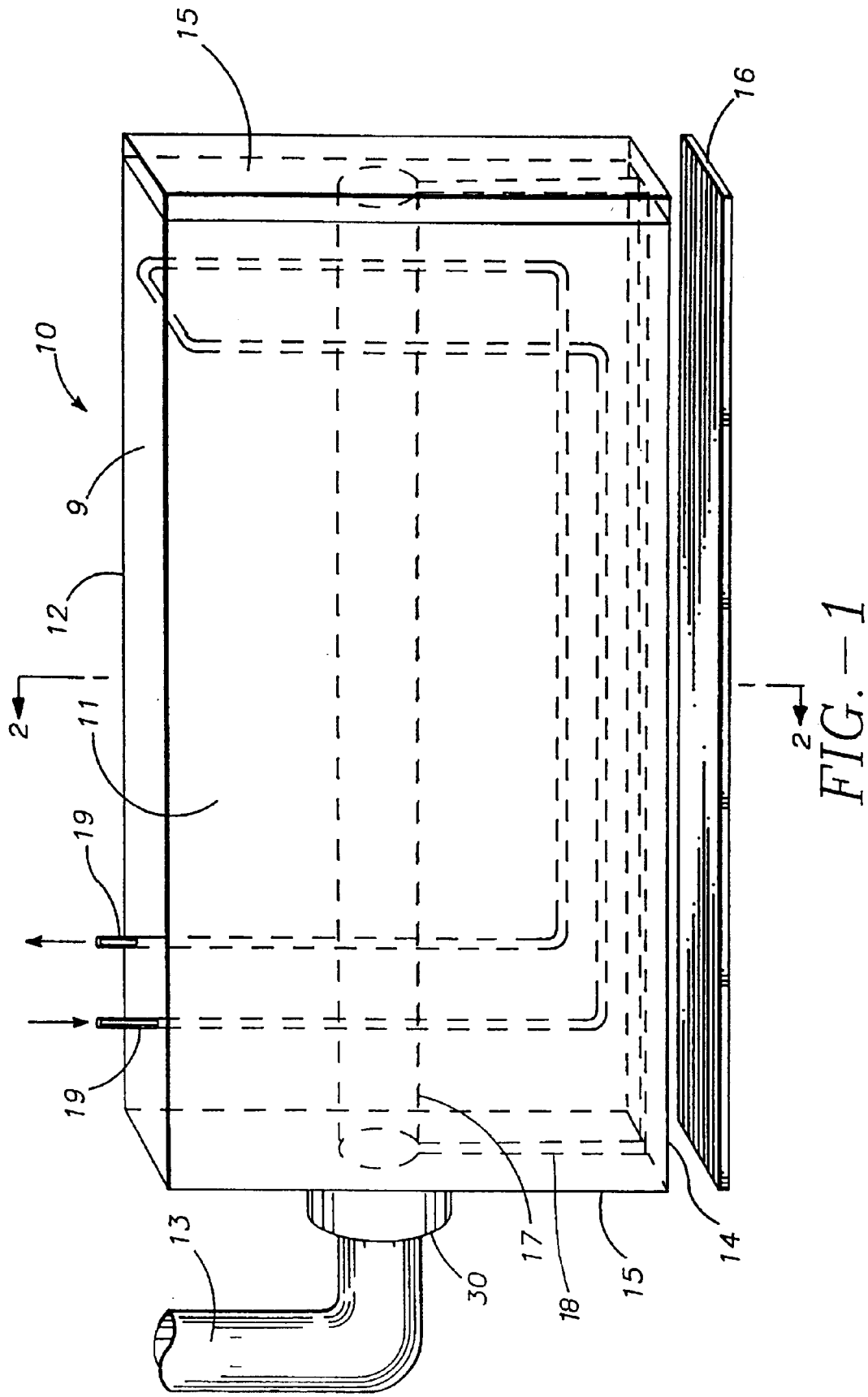
FIG. 1 is a side elevated view of an injector in accordance with one embodiment of the present invention.
Figure 2:
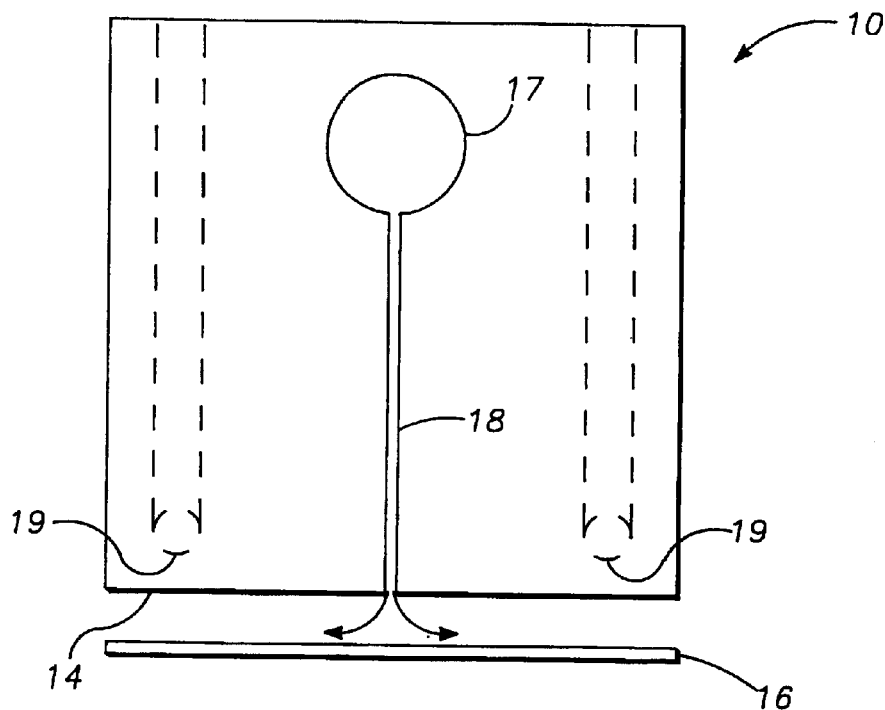
FIG. 2 is a cross-sectional view taken along the line 2—2 of FIG. 1 of one embodiment of the injector.

Turning to the drawings, wherein like components are designated by like reference numerals in the figures, FIGS. 1 and 2 represent one embodiment of the injector of the present invention. The injector 10 comprises a member or block which includes front 11, back 12, top 9, bottom 14 and end 15 surfaces. In this embodiment of the invention, the bottom surface 14 is the gas delivery surface. Positioned beneath injector 10 is a substrate 16.

The injector 10 includes a first elongated passage 17 formed in the injector 10 and extending between the end surfaces 15. One end surface 15 is closed. Chemical delivery line 13 leads to the end of the elongated passage 17. Additionally, formed in the injector 10 is a distribution channel 18 which extends between the elongated passage 17 and the gas delivery surface 14. A view along the length of the injector would show that the distribution channel 18 extends across the substrate 16. In this embodiment a second elongated passage 19 is formed within the injector 10, for circulation of a liquid or gas to control the temperature of the injector 10.

In a CVD process the gas which contains the elements to be deposited are introduced via chemical line 13 and flow along the passage 17 and from this passage 17 to the gas delivery surface 14 along the thin distribution channel 18. The gas flows out of the distribution channel 18 and exits the injector 10 along the length of the gas delivery surface 14, whereby the gas is delivered to a substrate as indicated generally by the arrows in FIG. 2. The gas is distributed by the injector in a substantially controlled linear manner. Although the member 10 has been described as a rectangular block, it can take any shape. The gas delivery surface 14 can be configured to enhance the distribution of the gas.

Figure 3:
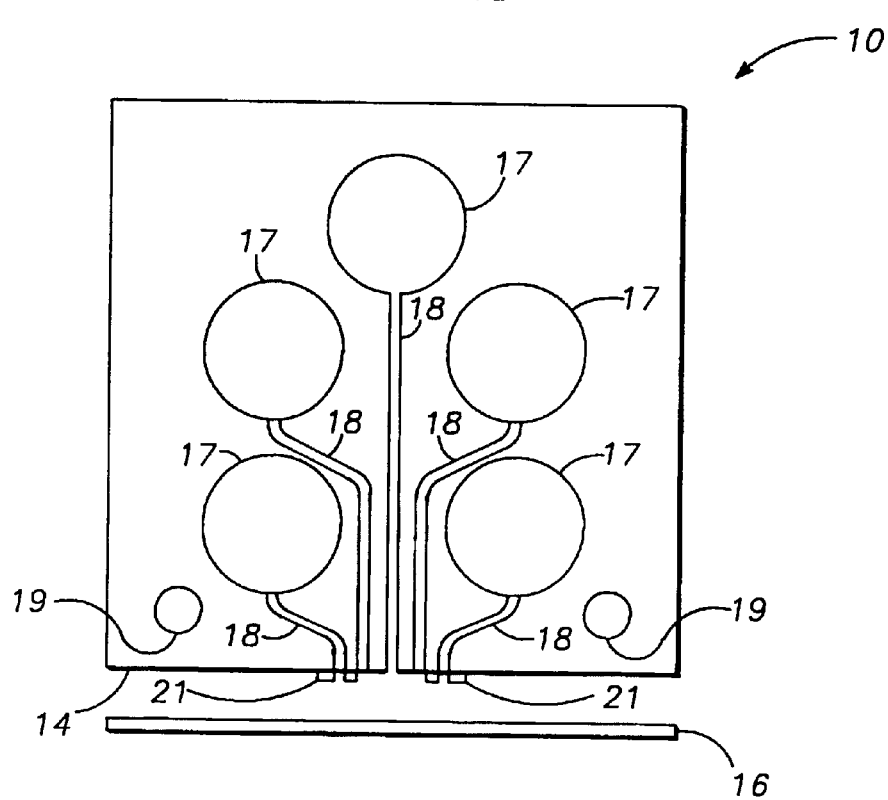
FIG. 3 is a cross-sectional view of an injector in accordance with a second embodiment of the invention.

In many applications a number of gases must be reacted to deposit a proper composition of a film or layer on an substrate. In such instances a plurality of passages is provided, as shown in FIG. 3, a second embodiment of the present invention. Injector 10 contains a plurality of first elongated passages 17, each extending between the end surfaces 15. A chemical delivery line 13 is attached to each passage 17. A plurality of distribution channels 18 are formed in the injector 10 and are spaced apart from one another. Each distribution channel 18 extends between a separate first elongated passage 17 and the gas delivery surface 14. Gases enter the passages 17 and are conveyed though the distribution channels 18 to the gas delivery surface 14, where such gases mix along the length and provide a film or layer upon the substrate 16. To enhance distribution of the gases, the distribution channels 18 direct the flow of the gases to a desired region adjacent to the substrate 16, as the gases exit along the gas delivery surface 14. Additionally, the distribution channels 18 prevent chemical fouling of the injector 10 by directing the gases away from the gas delivery surface thereby preventing premature reaction of the chemicals at such surface. Thus, the gases are individually distributed in a substantially linear flow manner to a desired region where the gases have an opportunity to mix, react and deposit a film or layer on substrate 16. Temperature control of the injector 10 may be accomplished by elongated passages 19.

A locator ridge 21, for locating the injector 10 in the CVD chamber, is provided which extends perpendicular from the gas delivery surface 14 and along the length of the surface 14, positioned outside the distribution channels 18. Although the locator ridge 21 has been described as extending from the gas delivery surface 14, it can be placed at other surfaces of the member 10.

Figure 4:
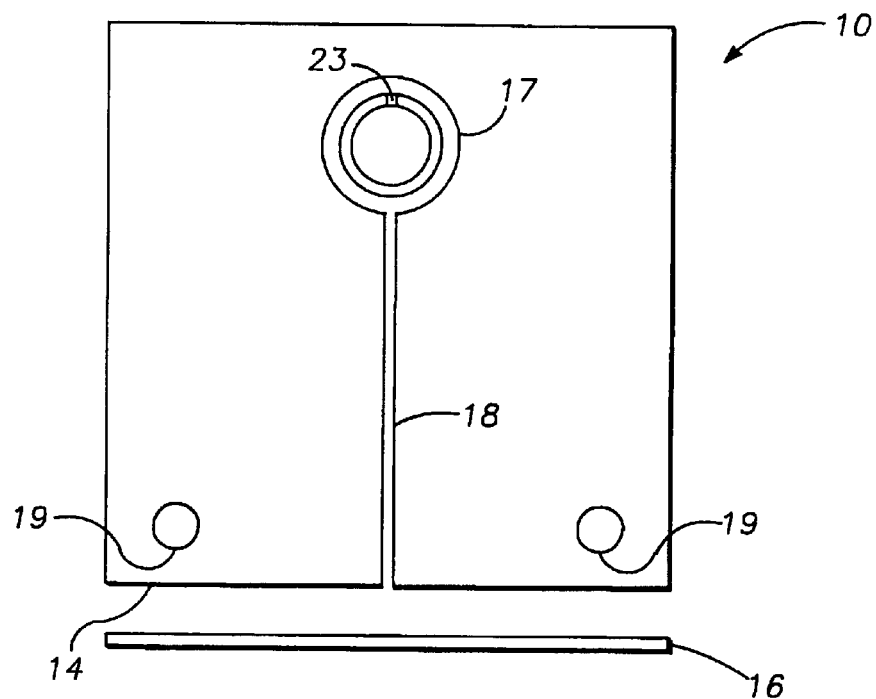
FIG. 4 is a cross-sectional view of an injector in accordance with a third embodiment of the invention.

In CVD applications it is desirable to maintain controlled flow and concentration of the gas introduced into the process. A metering tube 22 can be provided to maintain controlled flow and concentration. The metering tube 22 can also provide for control of the gas flow profile. In some instances it is desirable to provide a specified gas flow profile to compensate for variables in the CVD reaction area which can cause incomplete reaction of the gases and films which are not uniform in composition. For example, it may be desirable to direct a greater volume of gas to a particular area of the substrate 16. The third embodiment of the present invention illustrated in FIG. 4 provides a metering tube 22 containing an opening 23, inserted into the first elongated passage 17. The metering tube 22 is spaced from the walls of the passage 17, and extends between the end surfaces 15. A distribution channel 18 is formed within injector 10, and extends between the elongated passage 17 and the gas delivery surface 14. In one variation of this embodiment, the metering tube 22 includes openings 23, as depicted in FIG. 4. In another variation of this embodiment, the metering tube 22 is made from a porous material and openings are not included in the metering tube 22.

The metering tube 22 receives a gas from chemical line 13 and distributes the gas along the elongated passage 17, where the gas then flows through the distribution channel 18 to the gas delivery surface 14 and out to the substrate 16.

Figure 5:
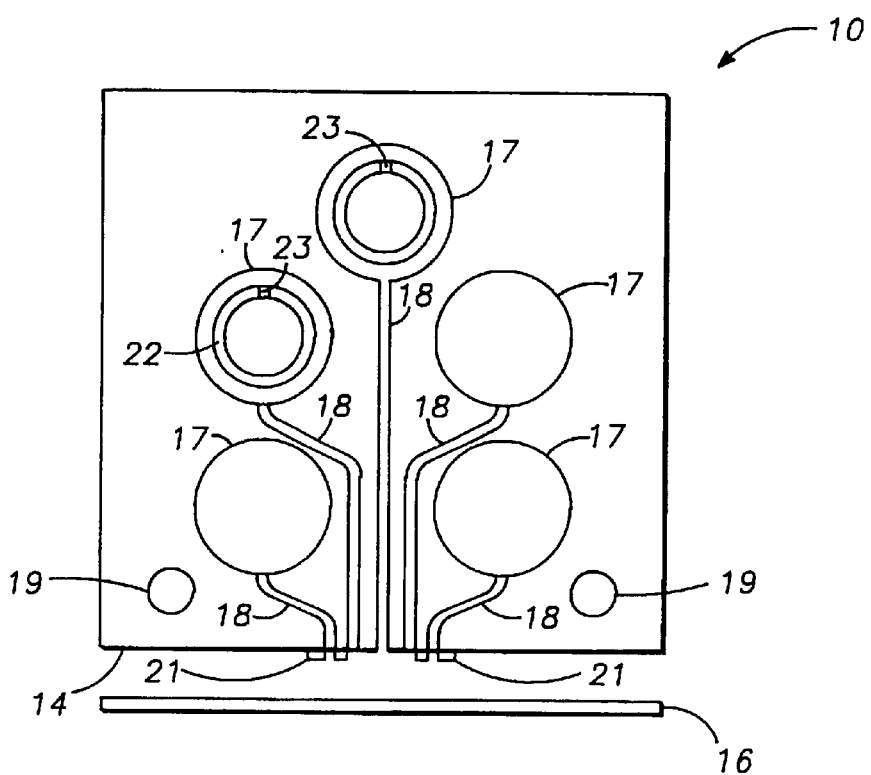
FIG. 5 is a cross-sectional view of an injector in accordance with a fourth embodiment of this invention.

FIG. 5 illustrates a forth embodiment of the present invention. A plurality of first elongated passages 17 are formed within injector 10, each extending between the end surfaces 15. A plurality of distribution channels 18 are formed in the injector 10 and the distribution channels 18 are spaced apart from one another. Each distribution channel 18 extends between a separate first elongated passage 17 and the gas delivery surface 14. At least one metering tube 22 containing an opening 23, is inserted into at least one of the first elongated passages 17. The metering tube 22 is spaced from the walls of the passage 17, and extends between the end surfaces 15. In a variation of this embodiment, a separate metering tube 22 may be inserted into each of the plurality of first elongated passages 17 provided. A chemical delivery line 13 is attached to each metering tube 22.

Referring again to FIG. 5, a locator ridge 21, for locating the injector 10 in the CVD chamber, is provided which extends perpendicular from the gas delivery surface 14 and along the length of the gas delivery surface 14, positioned outside the distribution channels 18. Temperature control may be accomplished by second elongated passages 19. Locator ridge 21 provides the mechanism for locating the injector 10 within the CVD chamber.

Thus, in the forth embodiment, chemical delivery lines 13 are attached to corresponding metering tubes 22, or to a combination of metering tubes 22 and first elongated passages 17, and convey gaseous chemicals thereto. The gases pass through the metering tubes 22 and into the surrounding first elongated passages 17, and are conveyed through the corresponding distribution channels 18 to the gas delivery surface 14 along the length of the surface. The distribution channels 18 enhance distribution of the gases by individually directing the flow of the gases to a desired region adjacent to the substrate 16. The metering tubes 22 may be used to adjust the flow profile of one particular gas, or a number of gases to deliver gases of varying concentration at desired regions adjacent to the substrate, thereby controlling the chemical reaction rate occurring within the CVD chamber. By controlling the chemical reaction rate a more uniform film can be deposited on the substrate 16.

In order to adjust the gas flow pattern, many variations may be made in the metering tubes 22. Where a metering tube comprises openings 23, such openings may be directed away from the distribution channel 18. Alternatively, the openings 23 may be directed toward the distribution channel 18. In the preferred embodiment, the openings are opposite the distribution channel. The various configurations of metering tubes 22 are more fully appreciated with reference to FIGS. 6 through 10.

Figure 6:
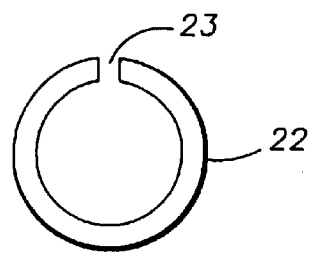
FIG. 6 is a cross-sectional view of the metering tube of the injector illustrated in FIGS. 4 and 5.

FIG. 6 depicts a cross-sectional view of metering tube 22 including an opening 23. Gas is conveyed through the metering tube and is outputted through opening 23. The configuration 15 of opening 23 controls the gas outlet flow profile.

Figure 7:
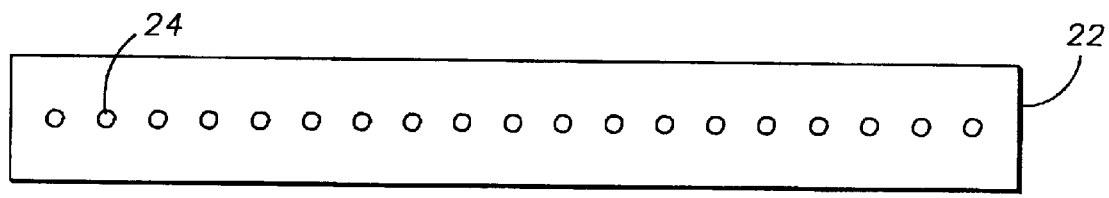
FIG. 7 illustrates a top plan view of one embodiment of an opening pattern in the metering tube of the injector shown in FIGS. 4, 5 and 6.

FIGS. 7 through 10 show the various opening configurations contemplated by the invention to provide adjustment to a desired gas flow pattern. Referring to FIG. 7, the openings 23 comprise a plurality of in-line holes 24 extending along the length of the metering tube 22. In this embodiment, the holes 24 are of equal diameter and equal spacing along the tube 22.

Figure 8:
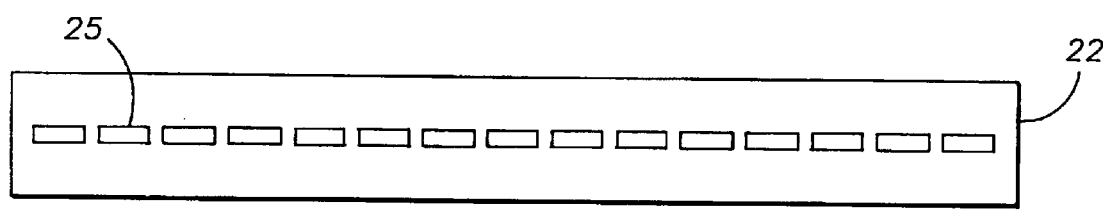
FIG. 8 is a top plan view of an alternative opening pattern in the metering tube of the injector shown in FIGS. 4, 5 and 6.

An alternative opening pattern is shown in FIG. 8, where the openings 23 comprise a plurality of in-line slots 25 extending along the length of the metering tube 22. The slots are of equal dimension and spacing along the tube 22.

Figure 9:
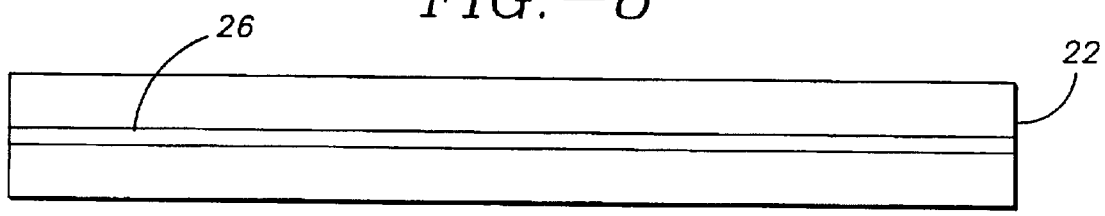
FIG. 9 illustrates a top plan view of a slotted opening in the metering tube of the injector shown in FIGS. 4, 5, and 6.

A further alternative opening pattern is depicted in FIG. 9, where a continuous slot 26 extends along the length of the metering tube 22.

Figure 10:
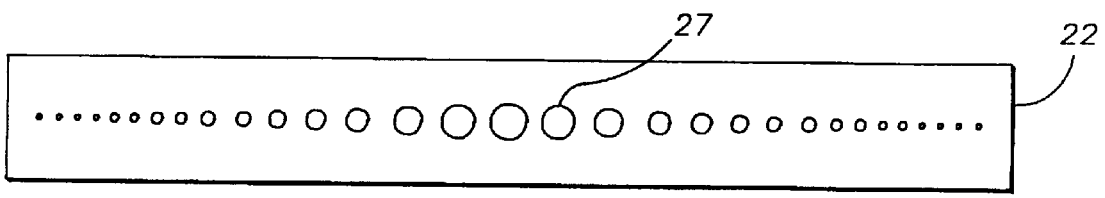
FIG. 10 is a top plan view of another alternative opening pattern in the metering tube of the injector shown in FIGS. 4, 5 and 6.

A still further alternative opening configuration is illustrated in FIG. 10. The openings 27 comprise a plurality of openings which vary in dimension, or pitch or a combination of both, along the length of the metering tube 22. The openings may be holes or slots. In one, the openings begin at a small dimension at each end of the metering tube 22, and gradually increase in dimension toward the center of the metering tube 22. The gas volume flow rate will be greater from the larger openings and thus the gas outlet flow pattern can be controlled.

Figure 11:
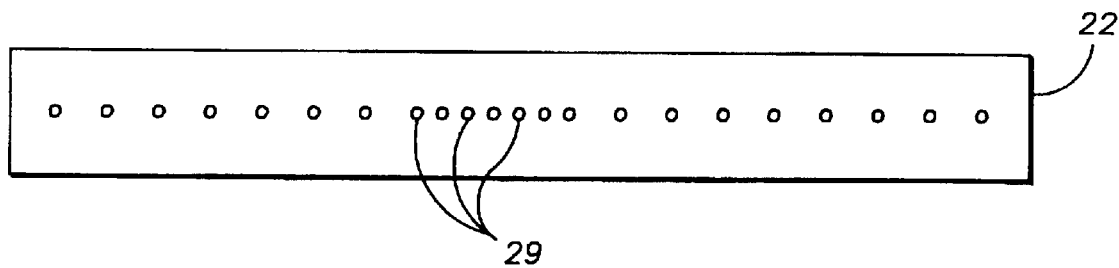
FIG. 11 is a top plan view of yet another alternative opening pattern in the metering tube of the injector shown in FIG. 4, 5 and 6.

A yet further alternative opening configuration is shown in FIG. 11. The openings 29 comprise a plurality of openings which are the same dimension and pitch along the length of the metering tube 22. Near the center of the metering tube 22, additional openings 29 are provided, such that the volume flow rate will be greater from the center of the metering tube 22.

Figure 12:
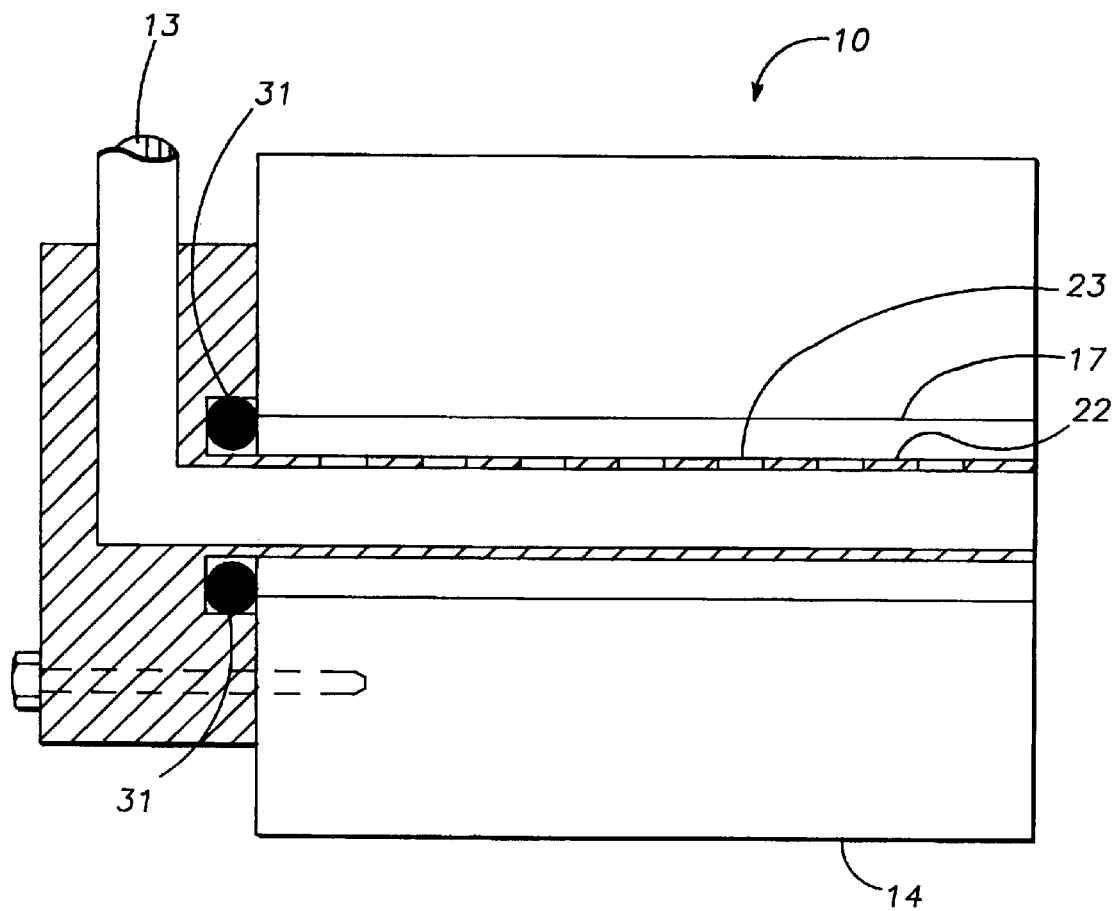
FIG. 12 illustrates an enlarged partial side view of the flange and metering tube attachment to the injector.

Finally, the attachment mechanism between the metering tube 22 and the chemical delivery lines 13 is more fully appreciated by reference to FIG. 12 which shows an enlarged partial side view of an attachment mechanism and metering tube of the injector. A metering tube 22 is inserted into a first elongated passage 17 and extends between the end surfaces 15. A flange 30 is attached to the chemical delivery line 13 and the flange is then attached to the end IS of the injector 10. A seal 31 is provided therebetween. The metering tube 22 is attached to the flange and provides for an air-tight seal.

Many variations of chemicals are used in CVD processes. The invention provides for various chemical delivery lines. In one embodiment the chemical delivery lines 13 may convey a combination of tetraethoxysilane (TEOS) and nitrogen in one line, nitrogen in a second line and ozone mixed with oxygen in a third line to form a layer of silicon dioxide.

As the foregoing illustrates, there are many variations possible for practicing the invention. The preferred embodiment comprises five first elongated passages, with five metering tubes inserted therein. The dimensions may vary, however in this preferred embodiment each passage is approximately ⅜ inches in diameter, and the outer diameter of each metering tube is approximately ¼ inch diameter. The metering tube contains fifty equally spaced holes of equal dimension along the length of the metering tube.

Various manufacturing techniques known in the art can be used to form the distribution channels 18. In the preferred embodiment the distribution channels are formed by a wire electrode discharge machine (EDM).

New Embodiment

Figure 13:
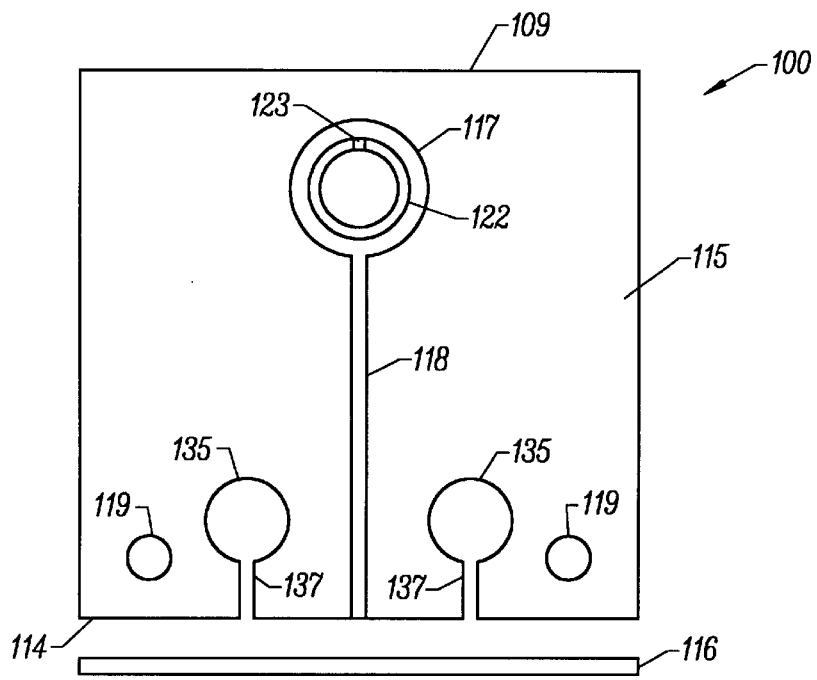
FIG. 13 is a cross-sectional view of an injector in accordance with an alternative embodiment of the invention which employs passages for delivering an etchant species.

In an alternative embodiment of the invention, at least one additional passage is provided for conveying an etchant species to the gas delivery surface and out to the area adjacent the wafer. Of particular advantage, the etchant species serves to remove any reaction deposits that build up on the surfaces of the injector and other regions around the injector which accumulate during processing of the wafer. Turning to FIG. 13 the embodiment is shown where, an injector 100 is provided comprises of a single member and having front, back (not shown), top 109, and end 115 surfaces, and a bottom gas delivery surface 114. A substrate 116 is positioned below the injector 100.

The injector 100 also includes a first elongated passage 117 formed in the injector 100 and extending between the end surfaces 115. Additionally, formed in the injector 100 is a distribution channel 118 which extends between the elongated passage 117 and the gas delivery surface 114. A view along the length of the injector would show that the distribution channel 118 extends across the substrate 116. As described above, as gas flows into passage 117 from chemical delivery lines, the gas flows along the passage 117 to the gas delivery surface 114 along the thin distribution channel 118. The gas flows out of the distribution channel 118 and exits the injector 100 along the length of the gas delivery surface 114, whereby the gas is delivered to a substrate in a substantially controlled manner. Another elongated passage 119 formed within the injector 100 may be provided for circulation of a liquid or gas to control the temperature of the injector 100. As described above, a metering tube 122 with opening 123 inserted into elongated passage 117 may also be provided.

During the deposition process, reactants and reaction by-products tend to accumulate on the external surfaces of the injector, as well as on other surfaces within the CVD system. As such deposits build, they can foul the operation of the injector and are the source of contaminants which end up in the deposited film. Of particular advantage, this embodiment of the present invention introduces an etchant species for removal of such deposits. Specifically, at least one elongated passage 135 is formed within the injector 100 and extends between the end surfaces 115. Distribution slot 137 is also formed within the injector 100 and extends between the elongated passage 135 to the gas delivery surface 114. While the exemplary embodiment shows two passages 135, it is to be understood that one or a number of passages 135 may be used. Elongated passage 135 serves to receive an etchant species, such as hydrofluoric acid (HF) and the like. The etchant species flows into passage 135 and through the distribution slot 137, where it is conveyed to the gas delivery surface 114. The etchant species contacts the gas delivery surface 114 and acts to etch away and remove deposits that have accumulated along the surface 114. Preferably, the etchant species is introduced before or after the deposition process has taken place. Alternatively, the etchant species may be conveyed during the deposition process to minimize the accumulation of deposits.

Figure 14:
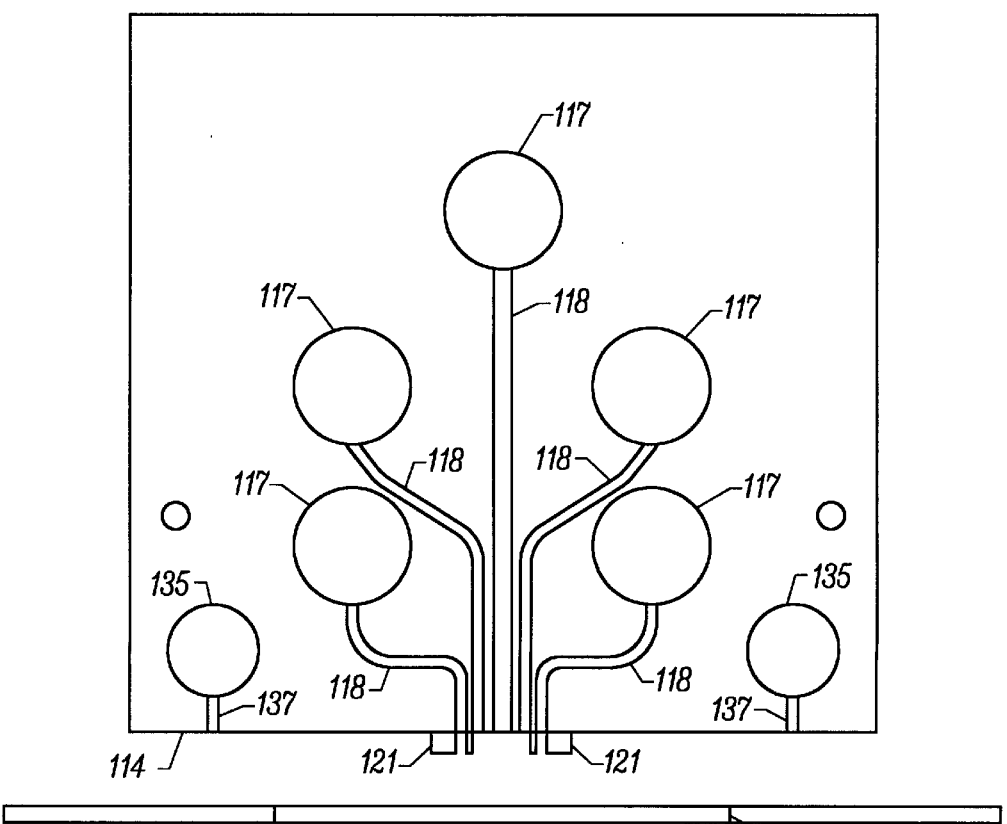
FIG. 14 is a cross-sectional view of an injector in accordance with another embodiment of the injector shown in FIG. 13.

FIG. 14 illustrates an alternative embodiment of the invention where a plurality of elongated passages 117 are used to deliver a plurality of gases. Elongated passages 135 and distribution slots 137 deliver an etchant species to the gas delivery surface 114 having a locator ridge 121. Again, as described above, a metering tube may be inserted into one or more of the elongated passages 117 for controlling the distribution profile of the gases.

Figure 15A:
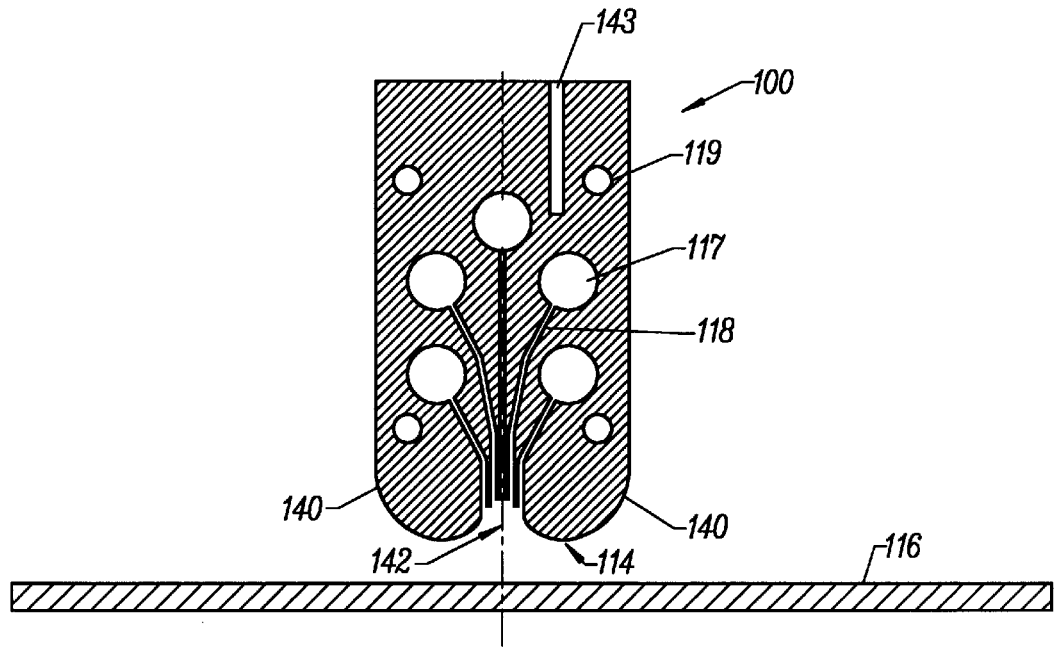
FIGS. 15a and 15b and 15c are cross-sectional views of an injector in accordance with a yet another embodiment of the present invention which includes a gas delivery surface having rounded side regions and a center recessed region.

An alternative embodiment of the present invention is now illustrated in FIGS. 15a though 15b. The injector 100 includes at least one elongated passage 117 and distribution slot 118 as described above, however in this case, the gas delivery surface 114 is different. Gas delivery surface 114 generally includes at least one, and preferably two, rounded side regions 140; and a center recessed region 142. Preferably, the distribution slots 118 extend from the each of their respective elongated passages 117 to the center recessed region 142 of the gas delivery surface 114. Gases flow into the passages 117 and through the distribution slots 118 where they are delivered to the center recessed portion 142 of the gas delivery surface 114 along the length of the injector 100. The gases are distributed in a substantially controlled manner along the gas delivery surface where they react and form a layer of material on the surface of the substrate 116 placed beneath the gas delivery surface 114. For temperature control of the injector, elongated passage 119 for receiving a cooling medium may be provided, and thermocouple well 143 formed in the injector 100 can be used to measure the temperature.

Figure 15B:
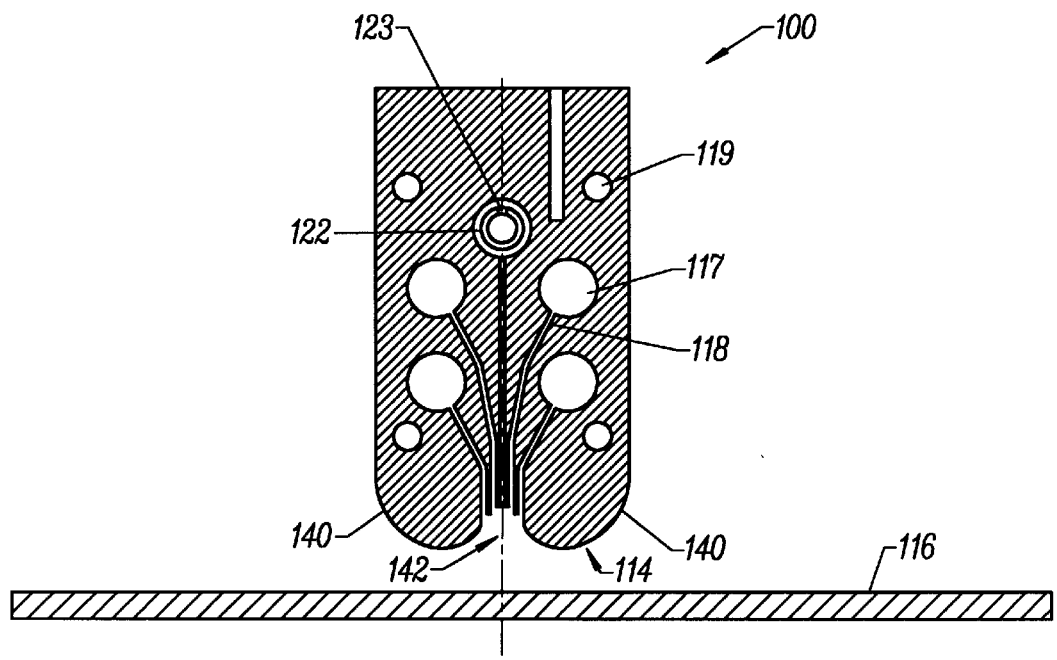

In FIG. 15b, a metering tube 122, is inserted into at least one of the elongated passages 117 and extending between the end surfaces 115. The metering tube 122 is spaced from the walls of the passage 117, and contains opening 123 which is directed away from the distribution slot 118. As described above, the opening 123 may be comprised of various patterns as shown in FIGS. 6 through 11. In a variation of this embodiment, a separate metering tube 22 may be inserted into each of the plurality of first elongated passages 17 provided. A chemical delivery line (not shown) is attached to each metering tube 22 for introduction of the gases.

Figure 15C:
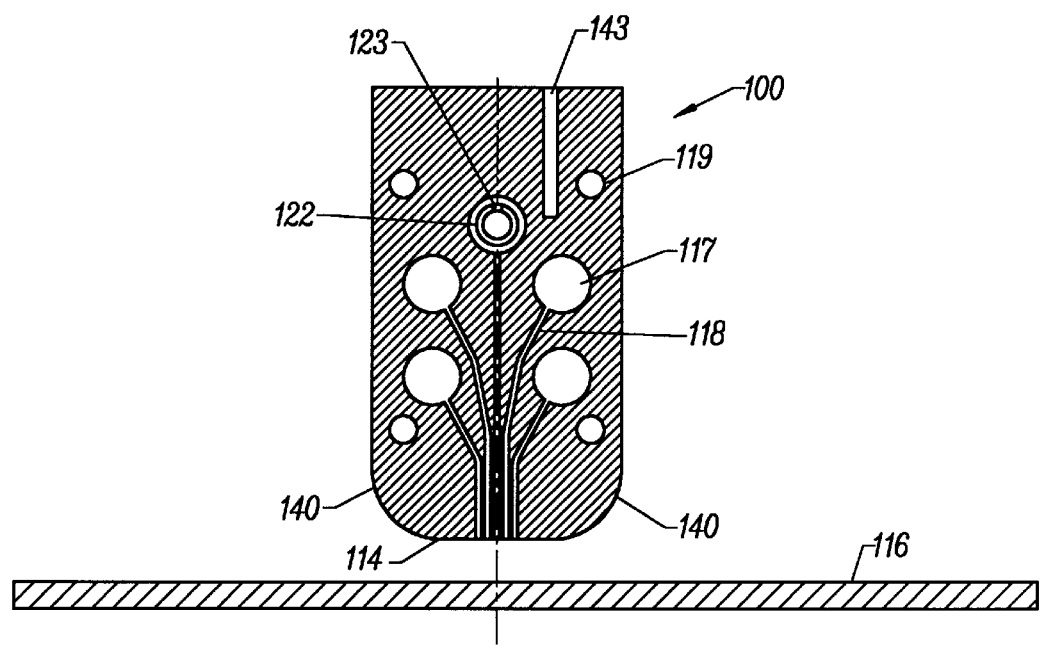

FIG. 15c shows another variation of the alternative embodiment. As shown, the gas delivery surface 114 includes only the rounded side regions 140. The remainder of the gas delivery surface 114 is substantially planar, and not recessed as in FIGS. 15a and 15b.

Figure 16A:
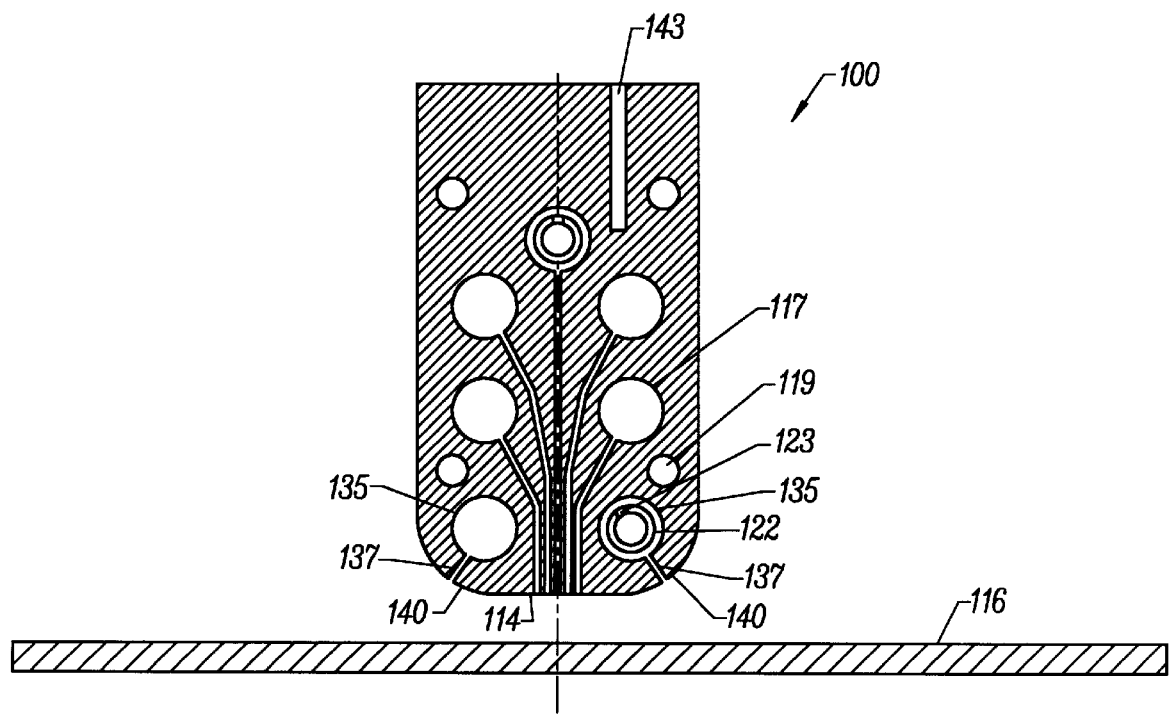
FIGS. 16a and 16b is a cross-sectional view of an injector in accordance with another embodiment of the injector shown in FIGS. 15a and 15b, which includes passages form delivering an etchant species.

Another alternative of the invention is shown in FIG. 16a. As illustrated, the injector 100 includes a plurality of first elongated passages 117 to receive a plurality of gases. The plurality of first elongated passages 117 each extend between the end surfaces 115, and a chemical delivery line (not shown) is attached to each passage 117 for separate conveyance of the gases. A plurality of distribution channels 118 are formed in the injector 100 and are spaced apart from one another. Each distribution channel 118 extends between a separate first elongated passage 117 and the gas delivery surface 114. Gas delivery surface 114 contains two rounded side regions 140, with the remainder of the gas surface 114 being substantially planar. Gases enter the passages 117 and are conveyed though the distribution channels 18 to the gas delivery surface 114, where such gases mix uniformly along the length and provide a film or layer upon the substrate 116.

To provide for removal of deposits on the surfaces of the injector 100, second elongated passages 135 for receiving an etchant species are also formed within the injector 100, and extend between the end surfaces 115. Distribution slots 137 are formed in the injector and extend between the second elongated passage 135 and the rounded side region of the gas delivery surface 114. In the exemplary illustration, the distribution slot 137 intersects the gas delivery surface 114 right at the beginning of the rounded side region 140, and at an angle to the to normal plane of the injector 100. The angle may vary depending upon the desired delivery point of the etchant species. This configuration promotes distribution of the etchant species towards the sides of the injector where deposits are generally most abundant. Alternatively, the distribution slot 137 may intersect the planar portion of the gas delivery surface.

Figure 16B:
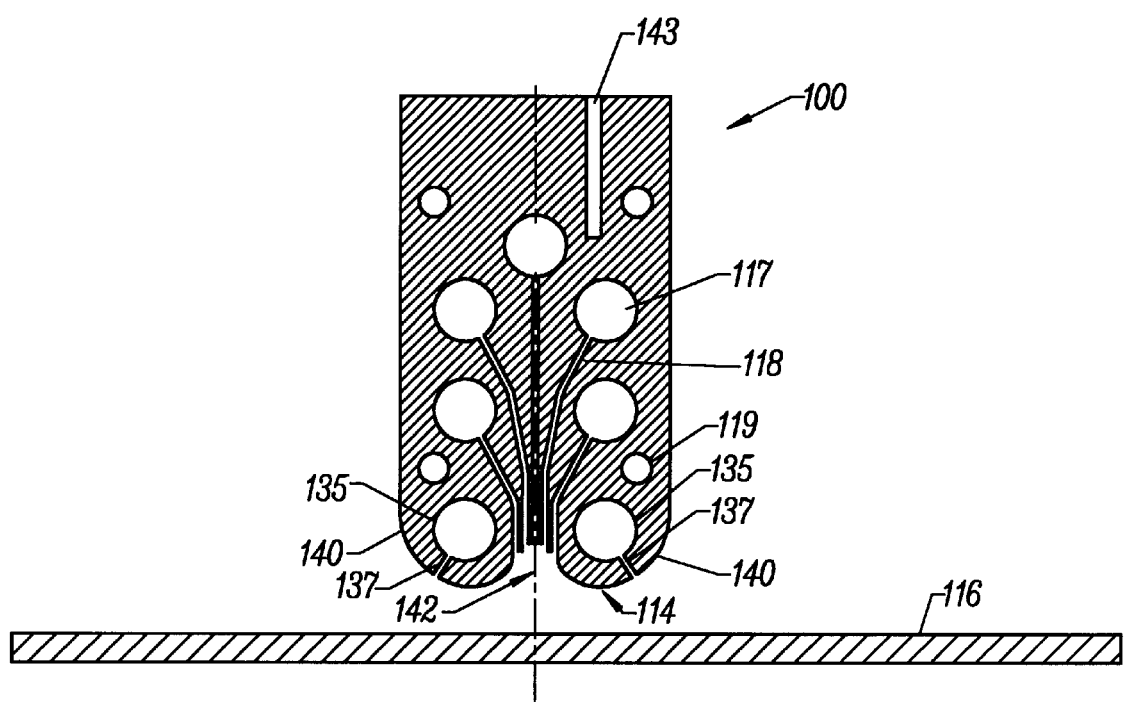

A variation of this embodiment is shown in FIG. 16b, which is the preferred embodiment. Here the gas delivery surface 114 contains two rounded side regions 140 and a center recessed region 142. The plurality of distribution slots 118 extend between each of their respective first elongated passages 117 and the center recessed region 142. To provide the etchant species, second elongated passages 135 are also formed within the injector 100, and extend between the end surfaces 115. Distribution slots 137 are formed in the injector and preferably extend between the second elongated passage 135 and the rounded side region of the gas delivery surface 114. Another advantage of the present invention provides for the metering of the etchant species thereby allowing control of the distribution of the etchant species to the external surfaces. To meter the etchant species, a metering tube 122, is inserted into at least one of the second elongated passages 135 and extending between the end surfaces 115. The metering tube 122 is spaced from the walls of the passage 135, and contains opening 123 which is directed away from the distribution slot 137. As described above, the opening 123 may be comprised of various patterns as shown in FIGS. 6 through 11. In a variation of this embodiment, a separate metering tube 22 may be inserted into each of a plurality of second elongated passages 135 provided. A chemical delivery line (not shown) is attached to each metering tube 122 for introduction of the etchant species.

As should be understood by one skilled in the art from the foregoing description, a variety of embodiments may be realized from the teaching of the present invention. For example, the injector may employ rounded side regions with or without the center recessed region, the use of metering tubes or not, the use of metering tubes in the etchant species passages or not, and the use of the etchant passages or not, and any combination of the above.

Injector Assembly

Figure 17:
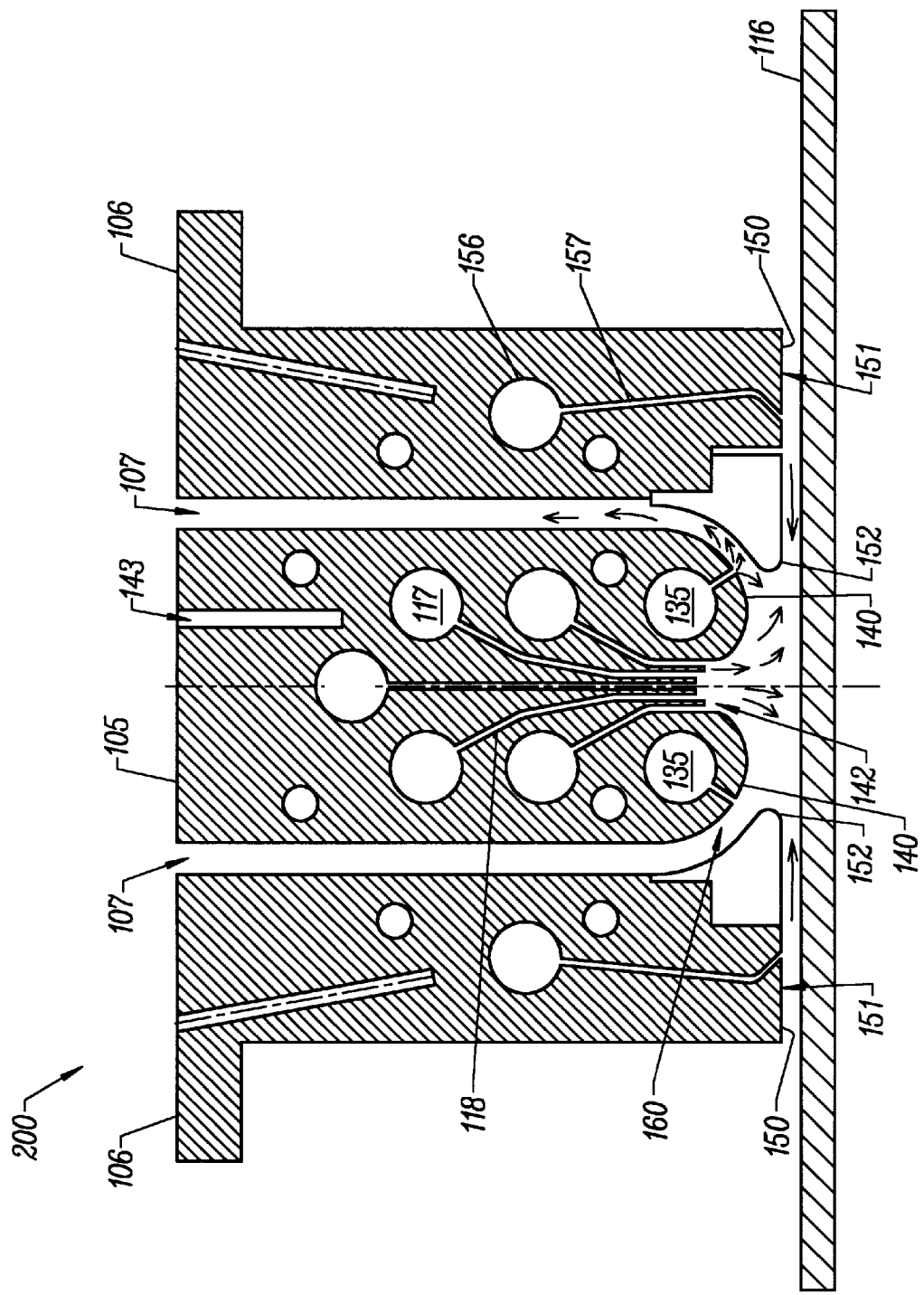
FIG. 17 is a cross-sectional view of an injector assembly having an injector member and a vent member in accordance with an alternative embodiment of the present invention.

In an alternative embodiment of the invention, an injector assembly 200 for delivering gases to a substrate is provided as shown in FIG. 17. The injector assembly 200 comprises a single injector member 105 and at least one single vent member 106. The vent member 106 is positioned adjacent and spaced from the injector member 105 to define at least one exhaust channel 107 therebetween. The injector member 105 is preferably comprised of the injector 100 of FIG. 16b and thus is a single member that includes a front, back, top and end surfaces, and a bottom gas delivery surface 114. Prefereably, the gas delivery surface 114 includes two rounded side regions 140 and a center recessed region 142. At least one first elongated passage 117 is formed in the injector member 105 and extends between the end surfaces for recieving a gas. Additionally, formed within the injector member 105 is at least one first distribution slot 118 which extends between the elongated passage 117 and the center recessed region 142 of the gas delivery surface 114. To assist in the prevention of deposit build-up on the surfaces of the injector and vent members 105 and 106, injector member 105 further includes at least one second passage 135 for receiving an etchant species formed in said injector member 105 and extending between the ends. At least one second distribution slot 137 is formed in the injector member 105 and extends between the second elongated passage 135 and one of the rounded side regions 140 of the gas delivery surface 114. The second distribution slot 137 may intersect the gas delivery surface 114 perpendicular to the plane of the surface 114 or at an angle depending upon the desired direction of the flow of the etchant species. In other words, the orientation of the second distribution slot 137 may be varied to direct the etchant species to certain surfaces of the injector assembly 200.

The vent member 106 comprises a single member with a front, back, top and end surfaces, and a bottom external surface 150. The external surface 150 generally includes a planar region 151 and at least one contoured side region 152. The contoured side region 152 is placed adjacent to and spaced from the rounded side portion 140 of the gas delivery surface 114 such that a rounded exhaust channel portion 160 is formed between the regions 140 and 152. The inventors have found that such a configuration minimizes recirculation of the gases in the region adjacent the substrate and in the entire exhaust channel 107. In the preferred embodiment, the vent member 106 also provides delivery of an etchant species to minimize the build-up of deposits within the injector assembly system. In this embodiment, the vent member 106 includes at least one elongated passage 156 formed in said vent member 106 and extending between the ends, for receiving an etchant species. A distribution slot 157 is formed within the vent member 106 and extends between the elongated passage 156 and the external surface 150 of the vent member 106 such that the etchant species is delivered along the external surface 150. Preferably, the distribution slot 157 exits the external surface 150 at the planar region 151, and intersects the surface at an angle such that the etchant species is directed toward the contoured side region 152. Alternatively, the distribution slot 157 may exit the external surface 150 at the contoured region 152. And in yet another variation, the distribution slot 157 is positioned to exit the external surface 150 in a perpendicular manner. Accordingly, it should be recognized that the present invention provides for varying the placement and the angle orientation of the distribution slot 157, thereby allowing the etchant species to be directed toward different regions. Such flexibility enhances the removal of accumulated deposits.

Figure 18:
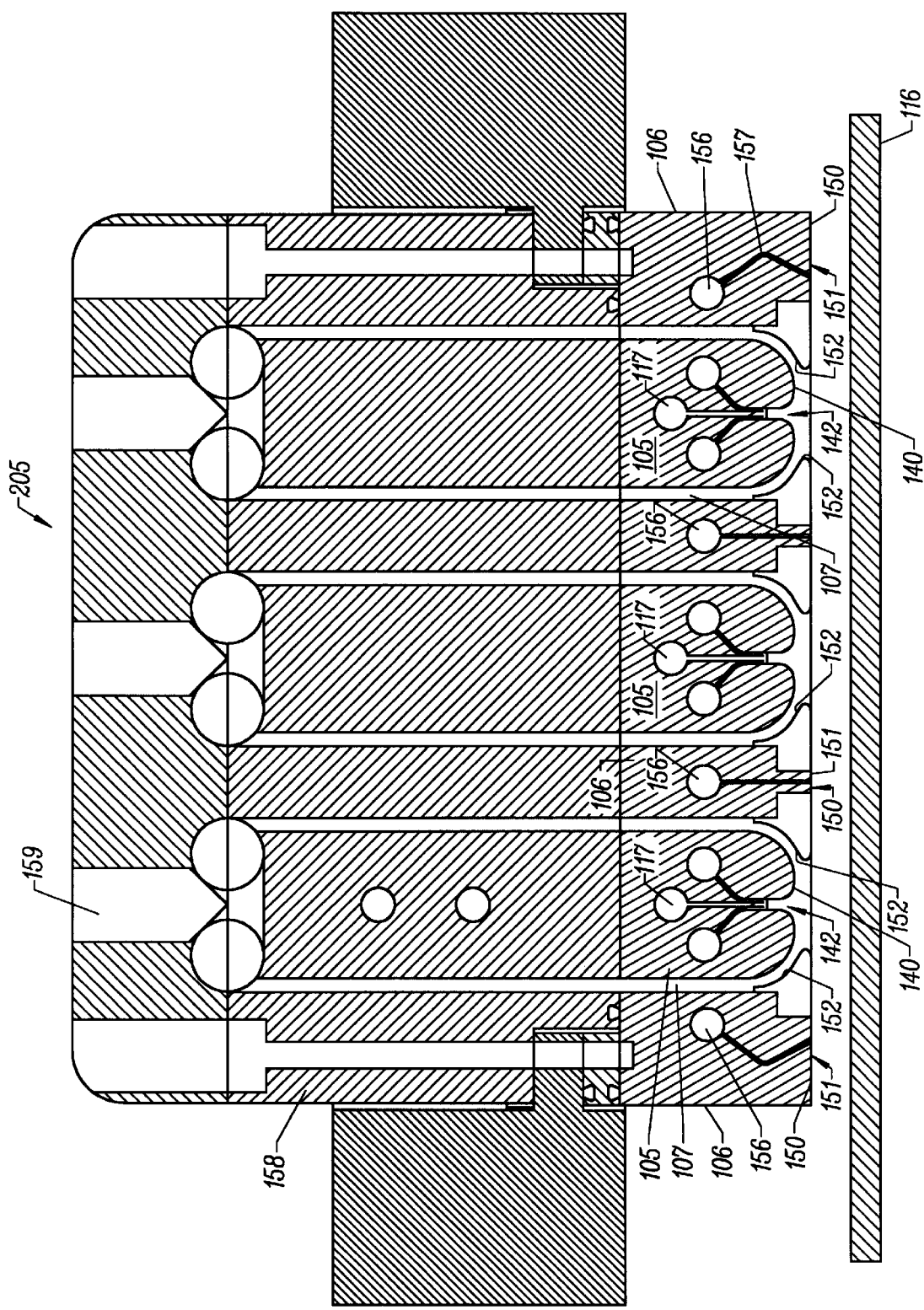
FIG. 18 is a cross-sectional view of an injector assembly containing multiple injector and vent members in accordance with another embodiment of the present invention.

To increase throughput of CVD systems, the invention provides for an injector assembly 205 comprising a plurality of injector members and vent members as illustrated in FIG. 18. The injector assembly 205 comprises a plurality of injector members 105 and a plurality of vent members 106. Each of the vent members 106 is positioned adjacent and spaced from each side of the plurality of injector members 105 to form a plurality of exhaust channels 107 therebetween. To remove the exhaust, an exhaust manifold 158 with exhaust outlet line 159 is mounted to the top of the plurality of injector and vent members 105 and 106. As shown in this exemplary illustration, the passages 135 for receiving an etchant species are omitted from the injector member 105. Alternatively, if desired, the etchant species passages and slots 135 and 137 may be used. Further, as shown in the exemplary embodiment, the injector assembly is comprised of three injector members, and four vent members, however it should be understood by those of skill in the art that other numbers may be used as well, as well as any of the injector and vent embodiments described above.

A particular advantage made apparent by the above description, is the simplicity of design of the injector. The invention eliminates the need for seals within the injector body. The present invention eliminates the requirement for welding and bolting of various internal body components. The present invention eliminates the requirement for precision alignment and positioning of internal body components necessary for proper gas flow in many injectors. The elimination of such components should minimize maintenance requirements, thereby reducing costly down time. In particular, the injector of the present invention will not have to be disassembled and rebuilt to replace failed internal seals. In addition, gaseous chemical leakage should be reduced.

Another improvement of the present invention is apparent by referring to the metering tubes. The metering tubes are replaceable, thus one can vary the configuration of gas flow desired by simply detaching one metering tube and inserting another metering tube of differing aperture placement or diameter. No disassembly of the injector body is required. Further, modeling or experimentation allow customized metering tubes to be manufactured for particular applications or machines.

The simplicity of the design favors formation of precise components and thus, greater control of gas distribution. The foregoing demonstrates an improved injector and injector assembly for delivering gaseous chemicals to a surface which fully satisfies the aims, advantages and objects set forth above.

While the invention has been described in connection with specific embodiments, it is evident that may variations, substitutions, alternatives and modifications will be apparent to those skilled in the art in light of the foregoing description. Accordingly, this description is intended to encompass all such variations, substitutions, alternatives and modifications as fall within the spirit of the appended claims.

What is claimed is:

1. An injector for providing gas distribution to a substrate, comprising:
    a single elongated member having end surfaces, and an elongated external gas delivery surface having rounded side regions and a center recessed region, said gas delivery surface extending along the length of the member directly facing the substrate;
    at least a first elongated passage formed in said elongated member and extending between the end surfaces for receiving a gas; and
    at least a first thin, elongated distribution slot of substantially constant width formed in said single elongated member and extending directly between said first elongated passage and the center recessed region of said gas delivery surface for carrying gas directly from said elongated passage for distribution in a continuous, unobstructed manner along the elongated external gas delivery surface.

2. The apparatus of claim 1, further comprising at least a second elongated passage formed in said elongated member and extending between the end surfaces for receiving an etchant species; and
    at least a second thin, elongated distribution slot formed in said single elongated member and extending directly between the at least a second elongated passage and at least one of the rounded side regions of said gas delivery surface for carrying the etchant species from said elongated passage for distribution along the elongated external gas delivery surface and directed away from the center recessed region towards the sides of the injector.

3. The apparatus of claim 1 further comprising at least a third elongated passage formed in said elongated member and extending between the ends serving to receive a medium for temperature control of the injector.

4. The apparatus of claim 1, further comprising at least one metering tube inserted into the at least a first elongated passage and spaced from the walls of said first elongated passage and extending between the ends, serving to receive the gas and distribute the gas along the elongated passage where it flows through the distribution slot to the substrate.

5. The apparatus of claim 4 wherein at least one of said plurality of metering tubes comprises a porous material.

6. The apparatus of claim 4 wherein at least one of said plurality of metering tubes comprises a slot extending along the length of said metering tube, said slot being directed away from the distribution slot.

7. The apparatus of claim 4 wherein at least one of said plurality of metering tubes comprises a plurality of openings along the length of said metering tube, and said openings being directed away from the distribution slot.

8. The apparatus of claim 7 wherein said plurality of openings vary in dimension along the length of said metering tube.

9. The apparatus of claim 7 wherein said plurality of openings vary in spacing along the length of said metering tube.

10. An injector for providing gas distribution to a substrate, comprising:
    a single elongated member having end surfaces, and an elongated external gas delivery surface having rounded side regions and a center recessed regions, said gas delivery surface extending along the length of the member directly facing the substrate;
    a plurality of first elongated passages formed in said elongated member and extending between the end surfaces for receiving a gas; and
    a plurality of first thin, spaced, elongated distribution slots each of substantially constant width formed in said single elongated member, one of said plurality of slots extending directly between each of said first elongated passages and the center recessed region of said gas delivery surface for carrying the gases directly from the respective passage to the gas delivery surface for distribution in a continuous, unobstructed manner along the substrate placed adjacent said delivery surface.

11. The injector of claim 10 further comprising:
    a plurality of second elongated passages formed in said elongated member and extending directly between the end surfaces, each serving to receive an etchant species; and a plurality of second thin, elongated distribution slots formed in said single elongated member, one of said plurality of slots extending directly between each of said second elongated passages and the rounded side regions of said gas delivery surface for carrying the etchant species from the respective passage to the gas delivery surface.

12. The apparatus of claim 11 wherein at least one of said plurality of metering tubes comprises a plurality of openings along the length of said metering tube, and said openings being directed away from the distribution slot.

13. The apparatus of claim 12 wherein said plurality of openings vary in dimension along the length of said metering tube.

14. The apparatus of claim 12 wherein said plurality of openings vary in spacing along the length of said metering tube.

15. The apparatus of claim 10, further comprising at least one metering tube inserted into said plurality of first elongated passages and spaced from the walls of said first elongated passages and extending between the ends, serving to receive the gas and distribute the gas along the elongated passage where it flows through the distribution slot to the substrate.

16. The apparatus of claim 15 wherein at least one of said plurality of metering tubes comprises a porous material.

17. The apparatus of claim 15 wherein at least one of said plurality of metering tubes comprises a slot extending along the length of said metering tube, said slot being directed away from the distribution slot.

* * * * *